(12) United States Patent
Gandhi

(10) Patent No.: US 6,633,237 B2
(45) Date of Patent: Oct. 14, 2003

(54) METHODS AND APPARATUS FOR DATA TRANSFER IN ELECTRONIC ENERGY METERS

(75) Inventor: Guljeet S. Gandhi, Noida (IN)

(73) Assignee: Analog Devices, Inc., Norwood, MA (US)

(*) Notice: Subject to any disclaimer, the term of this patent is extended or adjusted under 35 U.S.C. 154(b) by 418 days.

(21) Appl. No.: 09/777,736

(22) Filed: Feb. 5, 2001

(65) Prior Publication Data

US 2002/0107648 A1 Aug. 8, 2002

(51) Int. Cl.[7] .............................................. G08C 15/06
(52) U.S. Cl. ..................... 340/870.02; 324/142; 702/61
(58) Field of Search ...................... 340/870.02, 870.03, 340/870.05; 324/113, 142; 702/61

(56) References Cited

U.S. PATENT DOCUMENTS

| | | | |
|---|---|---|---|
| 5,017,860 A | 5/1991 | Germer et al. | |
| 5,231,347 A | 7/1993 | Voisine et al. | |
| 6,005,384 A | * 12/1999 | Hemminger et al. | ........ 324/142 |
| 6,043,642 A | * 3/2000 | Martin et al. | .................. 324/42 |
| 6,501,257 B1 | * 12/2002 | Elmore | ......................... 324/74 |

OTHER PUBLICATIONS

Putnam et al., "Design of Fractional Delay Filters Using Convex Optimization", *Department of Electrical Engineering and Center for Research in Music and Acoustics*, 4 pages.

* cited by examiner

*Primary Examiner*—Timothy Edwards
(74) *Attorney, Agent, or Firm*—Wolf, Greenfield & Sacks, P.C.

(57) ABSTRACT

An electronic meter, such as an electronic energy meter, includes a sensing circuit for sensing one or more values of a waveform, a memory having a memory bus, a digital signal processor coupled to the memory for calculating at least one parameter value of the waveform in response to the sensed values, and a microcontroller coupled to the memory for performing control functions of the electronic meter. The digital signal processor generates a bus request when access to the memory is required. The microcontroller grants access to the memory in response to the bus request. The sensing circuit may sense and digitize current and voltage values of a polyphase power line.

28 Claims, 3 Drawing Sheets

METHODS AND APPARATUS FOR DATA TRANSFER IN ELECTRONIC ENERGY METERS

FIELD OF THE INVENTION

This invention relates to electronic meters and, more particularly, to methods and apparatus for transferring data between a digital signal processor, memory and a microcontroller in electronic energy meters.

BACKGROUND OF THE INVENTION

Electronic energy meters have been developed for measuring the consumption of electrical energy on power lines. One architecture utilizes a digital signal processor for calculating various electrical parameters based on measured values of voltage and current, and a microcontroller for controlling the storage, display and communication of the electrical parameters calculated by the digital signal processor.

The parameter values calculated by the digital signal processor must be transferred to the microcontroller for storage, display and communication in an efficient and low cost manner. Typically, the digital signal processor and the microcontroller operate at different speeds. Conventional systems typically implement communication between two processors through a direct synchronous communication port, which limits communication speed, or by interfacing the processors on a data bus, which requires additional hardware, particularly when the processors are running at different speeds.

Accordingly, there is a need for efficient and low cost methods and apparatus for transferring data between a digital signal processor and a microcontroller in electronic energy meters.

SUMMARY OF THE INVENTION

According to a first aspect of the invention, an electronic meter is provided. The electronic meter comprises a sensing circuit for sensing one or more values of a waveform, a memory having a memory bus, a digital signal processor coupled to the memory for calculating at least one parameter value of the waveform in response to the sensed values, and a microcontroller coupled to the memory for performing control functions of the electronic meter. The digital signal processor comprises means for generating a bus request when access to the memory is required. The microcontroller comprises means for granting access to the memory in response to the bus request from the digital signal processor.

The sensing circuit may be configured for sensing and digitizing voltage and current values of a polyphase power line. The digital signal processor may comprise means for calculating one or more parameter values of the polyphase power line in response to the digitized voltage and current values and means for writing the calculated parameter values to the memory. The microcontroller may comprise means for reading the calculated parameter values from the memory when the microcontroller has access to the memory and means for supplying the calculated parameter values to a storage or display device.

The digital signal processor may generate a bus request interrupt to the microcontroller. The digital signal processor may further comprise means for clearing the bus request interrupt when the memory access operation is complete. The microcontroller may generate a grant access interrupt to the digital signal processor. The microcontroller may further comprise means for clearing the grant access interrupt after a predetermined timeout period. The digital signal processor and the microcontroller may operate a different frequencies.

According to another aspect of the invention, a method for operating an electronic meter is provided. The electronic meter comprises a sensing circuit for sensing one or more values of a waveform, a memory having a memory bus, a digital signal processor coupled to the memory for calculating at least one parameter value of the waveform in response to the sensed values, and a microcontroller coupled to the memory for performing control functions of the electronic meter. The method comprises the steps of the digital signal processor generating a bus request when access to the memory is required and the microcontroller granting access to the memory in response to the bus request from the digital signal processor.

According to a further aspect of the invention, an electronic energy meter is provided. The electronic energy meter comprises a sensing circuit for a sensing voltage and current values of a polyphase power line, a memory having a memory bus, a digital signal processor coupled to the memory for calculating parameter values of the polyphase power line in response to the sensed voltage and current values, and a microcontroller coupled to the memory for performing control functions of the electronic energy meter. The digital signal processor comprises means for generating a bus request when access to the memory is required. The microcontroller comprises means for granting access to the memory in response to the bus request from the digital signal processor.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
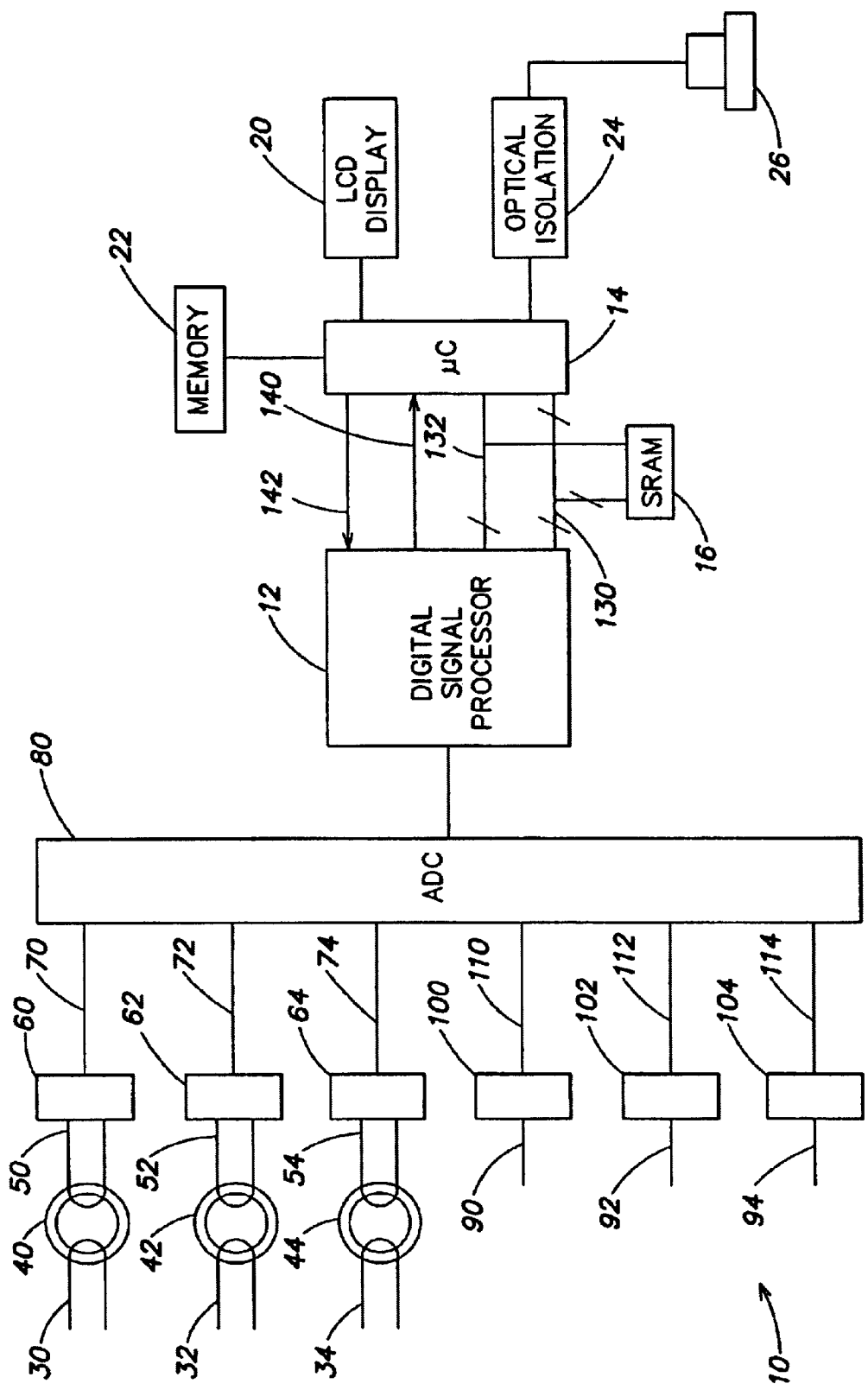
FIG. 1 is a block diagram of an electronic energy meter in accordance with an embodiment of the invention.

An example of an electronic meter in accordance with an embodiment of the invention is shown in FIG. 1. A three-phase electronic watt-hour meter includes a sensing circuit 10, a digital signal processor 12, a microcontroller 14 and a memory 16. The electronic meter may further include a display 20 and a memory 22 connected to microcontroller 14. The microcontroller 14 may be connected through an optical isolator 24 to an external terminal 26 or other external device. Other external devices, for example, may include printers, storage devices and/or communication links to remote monitoring devices.

In the embodiment of FIG. 1, sensing circuit 10 senses current and voltage values of the three-phase power line, digitizes the sensed current and voltage values and supplies the digitized current and voltage values to digital signal processor 12. Phase currents 30, 32 and 34 of the three-phase power line are supplied to primary windings of current transformers 40, 42 and 44, respectively. Secondary windings 50, 52 and 54 of current transformers 40, 42 and 44 are connected to terminating resistors 60, 62 and 64, respectively, to provide current signals 70, 72 and 74, which are proportional to the respective currents. The current signals 70, 72 and 74 are provided to an analog-to-digital converter 80. Phase voltages 90, 92 and 94 are supplied to voltage dividers 100, 102 and 104, respectively, to provide low level voltage signals 110, 112 and 114. The voltage signals 110, 112 and 114 are input to analog-to-digital converter 80. Analog-to-digital converter 80, which may be a multi-channel simultaneous or sequential sampling converter, digitizes the current and voltage signals and transmits the digitized signals to a serial port of the digital signal processor 12. In a preferred embodiment, the analog-to-digital converter 80 samples the signals at 15 kilohertz per channel.

The digital signal processor 12 receives the serial data from the analog-to-digital converter 80 and stores the data in its internal data memory. This raw data, representative of phase currents and voltages, is used by digital signal processor 12 to perform various computations over an integral number of line cycles. These computations may include the root mean square value of each phase voltage, the root mean square value of each line current and instantaneous value of active power. Multiplication of the root mean square value of current and voltage provides apparent power. Integration of these powers provides the respective energies. The ratio of apparent power to active power provides the power factor.

The digital signal processor 12 and the microcontroller 14 are connected to memory 16 by a data bus 130 and an address bus 132. In one embodiment, memory 16 is a static random access memory (SRAM) having a capacity of 512K bits, and data bus 130 is an 8-bit bus. The memory 16 may be used as a scratch pad between the digital signal processor 12 and the microcontroller 14 to read and write data without adversely affecting the operations of either processor. In one embodiment, the digital signal processor 12 performs calculations on the digitized current and voltage signals supplied from sensing circuit 10 to determine parameter values of the three-phase power line and writes the calculated parameter values to memory 16. The microcontroller 14 reads the parameter values from memory 16 and supplies the parameter values to memory 22 for storage, to display 20 and/or to external terminal 26.

Figure 2:
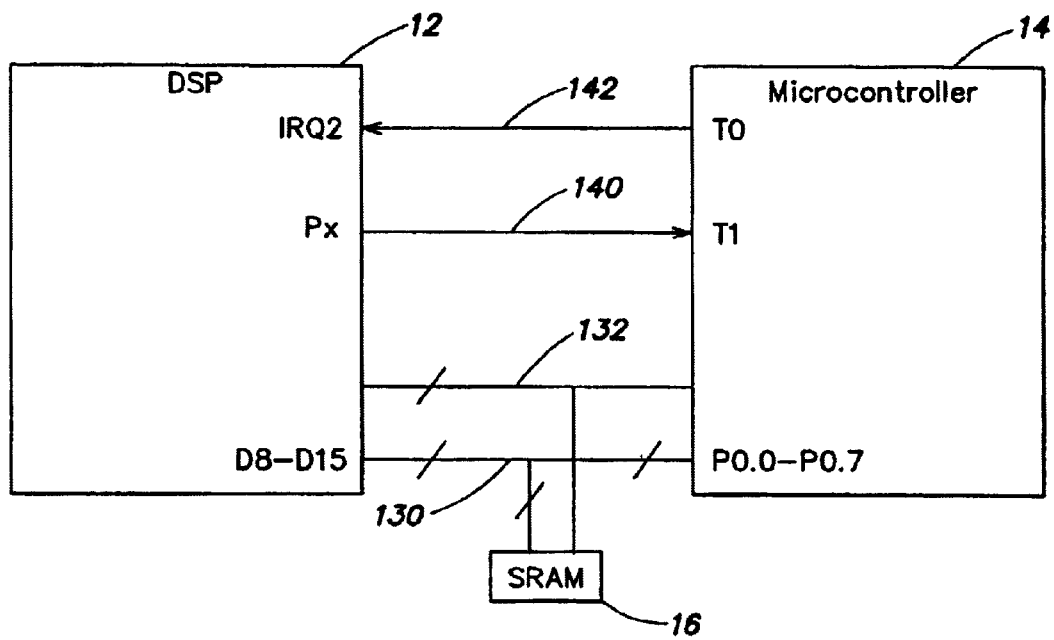
FIG. 2 is a block diagram of the digital signal processor, the microcontroller and the memory in the electronic energy meter of FIG. 1.
Figure 3:
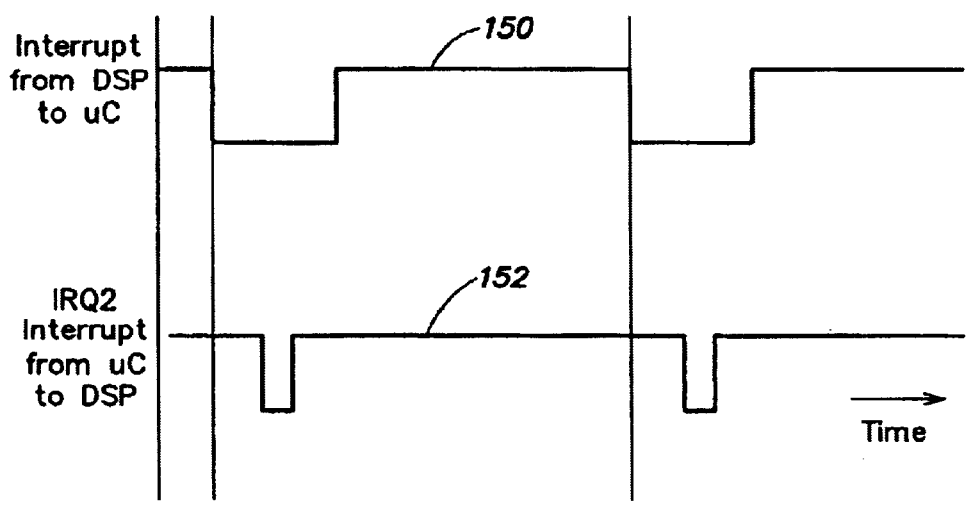
FIG. 3 is a timing diagram that illustrates an example of the memory access protocol utilized by the digital signal processor and the microcontroller.

To avoid contention for bus 130, the digital signal processor 12 and microcontroller 14 utilize a memory access or "handshaking" protocol, as illustrated in FIGS. 2 and 3. A digital signal processor pin Px is connected by a line 140 to a microcontroller pin T1, and a microcontroller pin T0 is connected by a line 142 to a digital signal processor pin IRQ2. The digital signal processor 12 may supply a bus request to microcontroller 14 on line 140. Microcontroller 14 may supply a grant access response to bus 130 to digital signal processor 12 on line 142. Each signal may be in the form of an interrupt to the respective processor. Thus, the digital signal processor 12 supplies a bus request interrupt on line 140, and microcontroller 14 supplies a grant access interrupt on line 142. In FIG. 3, signal 150 is an example of a bus request interrupt on line 140, and signal 152 is an example of a grant access interrupt on line 142.

When the digital signal processor 12 wishes to access memory 16 for reading or writing data, it sends a bus request to microcontroller 14 to free the bus 130 by sending a bus request interrupt on line 140. As shown in FIG. 3, signal 150 on line 140 may go to a low state to interrupt microcontroller 14. When the microcontroller 14 receives the bus request interrupt, it completes high priority tasks, makes the data bus 130 available and notifies the digital signal processor 12 by supplying a grant access interrupt on line 142, indicating that access to the bus has been granted and digital signal processor 12 can access memory 16. Signal 152 on line 142 may go to a low state to indicate that the bus request is granted.

Preferably, the digital signal processor 12 is not interrupted in executing its data acquisition and computation tasks. This is important to avoid loss of data resulting in inaccuracies in computations. The digital signal processor 12, after completion of execution for a finite number of line cycles, requests the microcontroller 14 to grant access to the data bus 130. After the microcontroller 14 grants access to data bus 130 and digital signal processor 12 has written data to memory 16, the digital signal processor 12 clears the interrupt to the microcontroller 14 by raising the signal 150 on line 140 to a high state. If the digital signal processor 12 does not clear the bus request interrupt on line 140, the microcontroller 14 waits for a predetermined timeout period. If the interrupt is not cleared within the predetermined timeout period, the microcontroller 14 interprets this as a loss of communication between digital signal processor 12 and microcontroller 14. The microcontroller 14 may continue with its operations and may provide an alarm or a display that indicates a malfunction of the digital signal processor 12.

Figure 4:
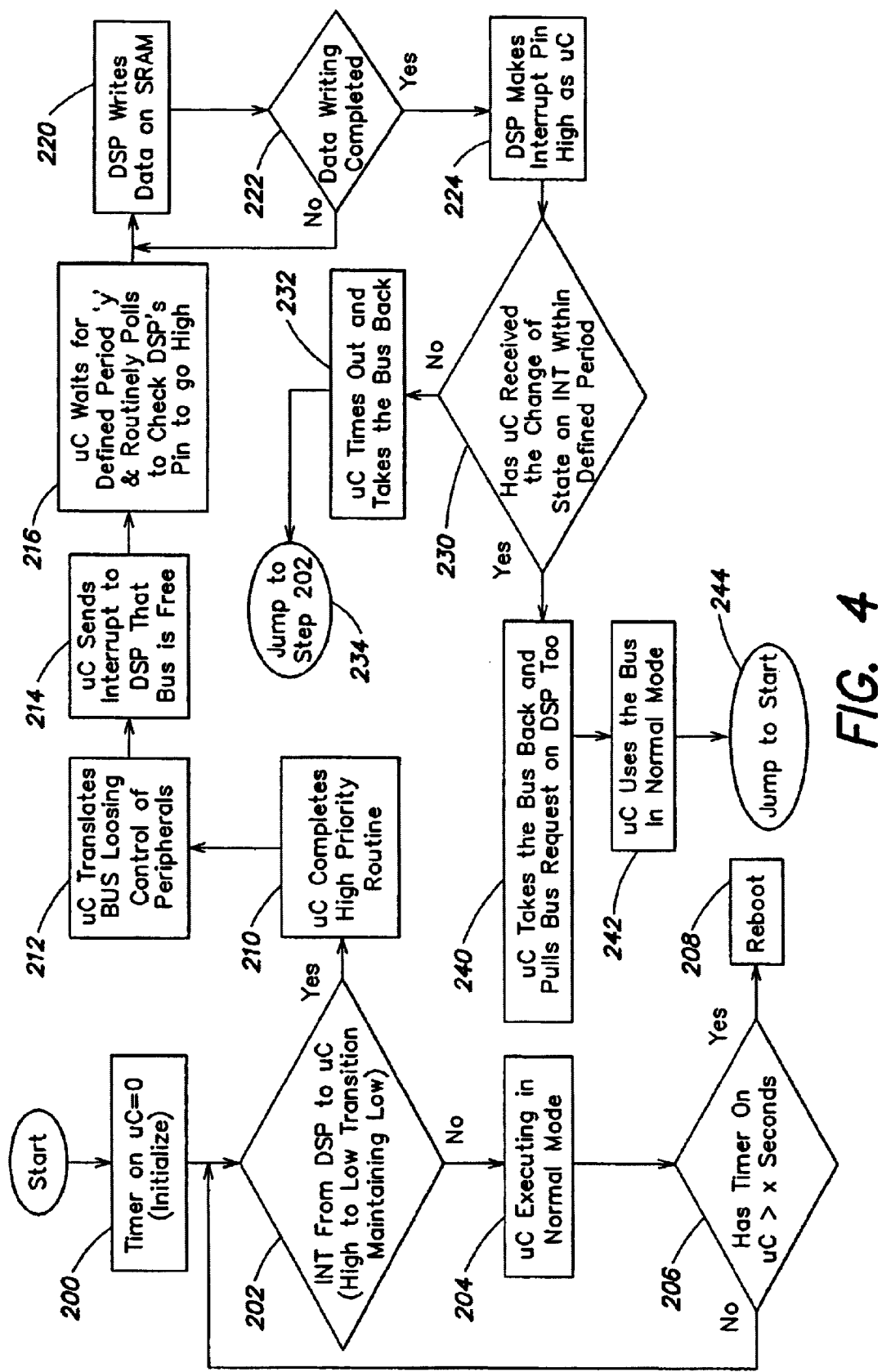
FIG. 4 is a flow diagram that illustrates an example of the memory access protocol utilized by the digital signal processor and the microcontroller.

A flow chart of a digital signal processor and microcontroller communication protocol in accordance with an embodiment of the invention is shown in FIG. 4. Preferably, the microcontroller 14 has control of data bus 130 until it receives a bus request interrupt from digital signal processor 12. In step 200, a timer in microcontroller 14 is initialized to zero and is started. The timer has a timeout period x, typically 70 milliseconds. In step 202, a determination is made as to whether a bus request interrupt has been received by microcontroller 14 from digital signal processor 12. If a bus request interrupt has not been received by microcontroller 14, microcontroller 14 executes in normal mode in step 204. In step 206, a determination is made as to whether the timer that was started in step 200 has timed out. If the timer has timed out, the electronic meter reboots in step 208. The failure to receive an interrupt from the digital signal processor within the timeout period is indicative of a malfunction of the digital signal processor, since it is programmed to perform calculations and write the results of the calculations to memory on a periodic basis. If a determination is made in step 206 that the timer has not timed out, the process returns to step 202.

If a determination is made in step 202 that an interrupt has been received from the digital signal processor 12, the microcontroller completes any high priority routine in progress in step 210. The bus request interrupt may correspond to signal 150 shown in FIG. 3 and described above. The microcontroller 14 then tristates the data bus 130 in step 212, thereby giving up control of any peripherals connected to data bus 130, such as, for example, a real time clock (RTC), flash memory and latches (not shown). In step 214, microcontroller 14 sends a grant access interrupt to digital signal processor 12, indicating that data bus 130 is available for use by digital signal processor 12. The grant access interrupt may correspond to signal 152 shown in FIG. 3 and described above. In step 216, the microcontroller 14 waits for a defined period y, typically 70 milliseconds, and routinely polls the interrupt pin T1 (FIG. 2) for a high state to detect clearing of the bus request interrupt by digital signal processor 12.

In step 220, digital signal processor 12 accesses memory 16 on data bus 130 and reads or writes data as necessary. In step 222, a determination is made as to whether the data access is completed. If the data access is not completed, reading or writing continues in step 220. If a determination is made in step 222 that the data access is completed, the digital signal processor 12 raises the interrupt line 140 to a high state in step 224, thereby clearing the bus request interrupt.

In step 230, the microcontroller makes a determination as to whether the bus request interrupt was cleared within the defined period y. If the bus request interrupt was not cleared within the defined period y, the microcontroller times out and resumes control of data bus 130 in step 232. The process then jumps to step 202 in step 234. If a determination is made in step 230 that the bus request interrupt was cleared within the defined period y, the microcontroller 14 resumes control of data bus 130 in step 240 and raises the grant access interrupt on line 142 to a high state. The microcontroller then uses the data bus 130 in the normal mode in step 242 and jumps to start in step 244.

The process illustrated in FIG. 4 and described above permits the digital signal processor 12 and the microcontroller 14 to access memory 16 without adversely affecting the operation of either processor. The digital signal processor 12 and the microcontroller 14 may operate at different clock speeds. The microcontroller 14 normally has control of data bus 130, but control is granted to digital signal processor 12 when a bus request interrupt is received by microcontroller 14. Digital signal processor 12 performs calculations on the digitized current and voltage signals and writes the results of the calculations in memory 16. After the digital signal processor 12 has completed writing to memory 16, the microcontroller 14 may read the calculated parameter values from memory 16 and supply the parameter values to display 20, memory 22 and/or an external device.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An electronic meter comprising:
   a sensing circuit for sensing one or more values of a waveform;
   a memory having a memory bus;
   a digital signal processor coupled to said memory for calculating at least one parameter value of the waveform in response to the sensed values, said digital signal processor including means for generating a bus request when access to said memory is required; and
   a microcontroller coupled to said memory for performing control functions of the electronic meter, said microcontroller comprising means for granting access to said memory in response to said bus request from said digital signal processor.

2. An electronic meter as defined in claim 1, wherein said bus request is timing independent.

3. An electronic meter as defined in claim 1, wherein said digital signal processor and said microcontroller operate at different frequencies.

4. An electronic meter as defined in claim 1, wherein said digital signal processor further comprises means for clearing the bus request interrupt.

5. An electronic meter as defined in claim 1, wherein said sensing circuit is configured for sensing one or more values of a polyphase power line.

6. An electronic meter as defined in claim 1, wherein said digital signal processor comprises means for writing the calculated parameter value to said memory when access to said memory has been granted by said microcontroller, and wherein said microcontroller comprises means for reading the calculated parameter value from said memory when said microcontroller has access to said memory and for supplying the calculated parameter value to a storage or display device.

7. An electronic meter as defined in claim 1, wherein said sensing circuit is configured for sensing and digitizing voltage and current values of a polyphase power line.

8. An electronic meter as defined in claim 7, wherein said digital signal processor comprises means for calculating one or more parameter values of said polyphase power line in response to the digitized voltage and current values and means for writing the calculated parameter values to said memory.

9. An electronic meter as defined in claim 8, wherein said microcontroller includes means for reading the calculated parameter values from said memory after the bus request is cleared by said digital signal processor.

10. An electronic meter as defined in claim 1, wherein said means for generating a bus request comprises means for generating a bus request interrupt to said microcontroller.

11. An electronic meter as defined in claim 10, wherein said means for granting access to said memory comprises means for generating a grant access interrupt to said digital signal processor.

12. An electronic meter as defined in claim 11, wherein the bus request interrupt and the grant access interrupt are separate from said memory bus.

13. An electronic meter as defined in claim 11, wherein said microcontroller further comprises means for clearing the grant access interrupt after a predetermined timeout period.

14. A method for operating an electronic meter comprising a sensing circuit for sensing one or more values of a waveform, a memory having a memory bus, a digital signal processor coupled to said memory for calculating at least one parameter value of the waveform in response to the sensed values, and a microcontroller coupled to said memory for performing control functions of the electronic meter, said method comprising the steps of:
   said digital signal processor generating a bus request when access to said memory is required; and
   said microcontroller granting access to said memory in response to said bus request from said digital signal processor.

15. A method as defined in claim 14, wherein said digital signal processor and said microcontroller operate at different frequencies.

16. A method as defined in claim 14, further comprising said digital signal processor calculating one or more parameter values of a polyphase power line in response to the sensed voltage and current values and writing the calculated parameter values to said memory.

17. A method as defined in claim 14, further comprising said digital signal processor writing the calculated parameter value to said memory when access to said memory has been granted by said microcontroller, and said microcontroller reading the calculated parameter value from said memory when said microcontroller has access to said memory and supplying the calculated parameter value to a storage or display device.

18. A method as defined in claim 14, wherein the step of generating a bus request comprises generating a bus request interrupt to said microcontroller.

19. A method as defined in claim 18, wherein the step of granting access to said memory comprises generating a grant access interrupt to said digital signal processor.

20. A method as defined in claim 19, further comprising the step of said digital signal processor clearing said bus request interrupt.

21. A method as defined in claim 19, further comprising the step of said microcontroller clearing the grant access interrupt after a predetermined timeout period.

22. An electronic energy meter comprising:
- a sensing circuit for sensing voltage and current values of a polyphase power line;
- a memory having a memory bus;
- a digital signal processor coupled to said memory for calculating parameter values of the polyphase power line in response to the sensed voltage and current values, said digital signal processor comprising means for generating a bus request when access to said memory is required; and
- a microcontroller coupled to said memory for performing control functions of the electronic energy meter, said microcontroller comprising means for granting access to said memory in response to said bus request from said digital signal processor.

23. An electronic energy meter as defined in claim 22, wherein said digital signal processor comprises means for writing the calculated parameter values to said memory when access to said memory has been granted by said microcontroller and wherein said microcontroller comprises means for reading the calculated parameter values from said memory when said microcontroller has access to said memory and means for supplying the calculated parameter values to a storage or display device.

24. An electronic energy meter as defined in claim 22, wherein said digital signal processor and said microcontroller operate at different frequencies.

25. An electronic energy meter as defined in claim 22, wherein said microcontroller further comprises means for clearing the grant of access to said memory after a predetermined timeout period.

26. An electronic energy meter as defined in claim 22, wherein said digital signal processor further comprises means for clearing the bus request.

27. An electronic energy meter as defined in claim 22, wherein said sensing circuit is configured for digitizing the sensed voltage and current values of the polyphase power line.

28. An electronic energy meter as defined in claim 27, wherein said digital signal processor comprises means for calculating one or more parameter values of said polyphase power line in response to the digitized voltage and current values and means for writing the calculated parameter values to said memory.

* * * * *